(12) United States Patent
Solapurkar et al.

(10) Patent No.: US 12,345,777 B2
(45) Date of Patent: Jul. 1, 2025

(54) METALLIC CONDUIT ELECTRICAL DISCONTINUITY WIRELESS DETECTION SYSTEM AND METHOD

(71) Applicant: Eaton Intelligent Power Limited, Dublin (IE)

(72) Inventors: Guruprasad Narayan Solapurkar, Maharashtra (IN); Saurabh Jayantilal Barot, Gujarat (IN); Amresh Kumar, Bihar (IN); Manisha Rajnale, Maharashtra (IN)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 17/881,201

(22) Filed: Aug. 4, 2022

(65) Prior Publication Data

US 2023/0044891 A1   Feb. 9, 2023

Related U.S. Application Data

(60) Provisional application No. 63/230,234, filed on Aug. 6, 2021.

(51) Int. Cl.
*G01R 31/54* (2020.01)
*G01R 31/08* (2020.01)
*G01R 31/58* (2020.01)

(52) U.S. Cl.
CPC ............ *G01R 31/54* (2020.01); *G01R 31/08* (2013.01); *G01R 31/58* (2020.01)

(58) Field of Classification Search
CPC ........ G01R 31/54; G01R 31/08; G01R 31/58; G01R 31/11
See application file for complete search history.

(56) References Cited

U.S. PATENT DOCUMENTS 4,075,675 A * 2/1978 Burkett ................ H02H 11/001
361/48
9,069,019 B2   6/2015 Hagenmaier, Jr.
(Continued)

FOREIGN PATENT DOCUMENTS

WO          9100990 A1    1/1991
WO      2012135103 A2   10/2012

OTHER PUBLICATIONS

International Search Report and Written Opinion, PCT/EP2022/025365, Nov. 21, 2022, 10 pages.

*Primary Examiner* — Feba Pothen
(74) *Attorney, Agent, or Firm* — Merchant & Gould P.C.

(57) ABSTRACT

The present disclosure relates to wireless electrical discontinuity detection methods and systems, the systems including at least one conduit having an outer layer including an electrically conductive material, an electrical signal generator electrically coupled to the at least one conduit, the electrical signal generator being configured to deliver electrical signals to the outer layer of the at least one conduit, and a detector device in electrical communication with the electrical signal generator and configured to detect an electrical signal from the electrically conductive outer layer, the detector device being configured to identify at least one of electrical connection and ground discontinuity in the at least one conduit based on the detected electrical signal, wherein the detector device is in wireless communication with a control station.

30 Claims, 5 Drawing Sheets

(56) References Cited

U.S. PATENT DOCUMENTS

| | | |
|---|---|---|
| 9,377,492 B2 | 6/2016 | Vincent |
| 10,156,602 B2 | 12/2018 | Taylor |
| 10,451,576 B2 | 10/2019 | Freer |
| 2005/0007121 A1* | 1/2005 | Burnett .................. G01N 17/02 |
| | | 324/533 |
| 2009/0128972 A1* | 5/2009 | Wu ........................ G01R 31/42 |
| | | 361/85 |
| 2016/0187393 A1* | 6/2016 | Ramirez .............. G01R 19/155 |
| | | 324/126 |
| 2016/0306001 A1 | 10/2016 | Taylor |
| 2022/0334166 A1* | 10/2022 | Van Rossum ............ H01B 7/32 |

\* cited by examiner

METALLIC CONDUIT ELECTRICAL DISCONTINUITY WIRELESS DETECTION SYSTEM AND METHOD

PRIORITY

This application claims priority from U.S. Provisional Patent Application No. 63/230,234, titled "Metallic Conduit Electrical Discontinuity Wireless Detection System and Method" and filed on Aug. 6, 2021, the contents of which being incorporated herein by reference in their entirety.

TECHNICAL FIELD

The present disclosure relates generally to methods and systems for detecting electrical discontinuity of metallic conduits, specifically to systems and methods for wirelessly detecting electrical discontinuity of metallic conduits.

BACKGROUND

Conduit systems are used to carry electrical conductors. The conduits that are part of a conduit system protect underlying electric wiring from detrimental environmental conditions such as, e.g., erosion, corrosion, and other harsh environmental conditions. A conduit includes a conducting layer on a surface thereof and is electrically coupled to ground (e.g., Earth ground). It is typically advantageous that these conduit systems maintain an active and good ground connection. If the conduit grounding circuit is compromised, a spark, shorting event, or other adverse electrical condition may occur.

Systems installed in harsh and hazardous locations are susceptible to corrosion, rust, and/or other factors that can lead to the deterioration of the grounding continuity of conduits within the conduit system. For example, corrosion and rust may weaken or damage the conductive layer of a conduit, causing conductivity loss and a disconnection with the ground. It is thus advantageous to monitor the integrity of the conductive layers of conduits in order to identify damage at, e.g., a particular location in the conduit system. Accordingly, a system and method to promptly identify ground discontinuity of conduits that hold electrical conductors within may be advantageous.

SUMMARY

One aspect of the present disclosure relates to a wireless electrical discontinuity detection system that includes at least one conduit having an outer layer including an electrically conductive material, an electrical signal generator electrically coupled to the at least one conduit, the electrical signal generator being configured to deliver electrical signals to the outer layer of the at least one conduit, and a detector device in electrical communication with the electrical signal generator and configured to detect an electrical signal from the electrically conductive outer layer, the detector device being configured to identify at least one of electrical connection and ground discontinuity in the at least one conduit based on the detected electrical signal, wherein the detector device is in wireless communication with a control station.

In an example of the above aspect, the electrical signal generator is a DC pulse circuit. In examples, the DC pulse circuit is configured to deliver DC voltage for a duration of up to 100 ms, the DC pulse circuit is configured to deliver DC voltage for a duration of up to 50 ms, the DC pulse circuit is configured to deliver DC voltage for a duration of up to 20 ms, or the DC pulse circuit is configured to deliver a DC voltage of up to 5 V. In another example, the DC pulse circuit is battery operated. In other examples, the detector device is in wireless communication with the control station via a wireless transmitter module. For example, the wireless transmission module is an RF transmitter module. In yet another example, the electrical signal generator is housed within the at least one conduit. For example, one of the plurality of conduits is coupled to an adjacent one of the plurality of conduits.

In other examples of the above aspect, the one of the plurality of conduits includes a first mating thread at an outer surface thereof, and the adjacent one of the plurality of conduits includes a second mating thread at an inner surface thereof, the second mating thread being configured to mate with the first mating thread to connect the one of the plurality of conduits with the adjacent one of the plurality of conduits. In an example, the at least one conduit includes a cavity. For example, the cavity of the at least one conduit is tubular in shape. Also for example, the cavity of the at least one conduit extends over a length of the at least one conduit. In a further example, the at least one conduit includes an electrically conductive material connected to ground. In another example, the at least one conduit is configured to receive one or more electrical cables therein.

Another aspect of the disclosure relate to a method of evaluating electrical discontinuity for a metallic conduit, the method sending an electrical signal from an electrical signal generator across the metallic conduit, detecting the sent electrical signal transmitted across the metallic conduit, determining whether an electrical connection exists based on the detected sent electrical signal, sending a confirmation of electrical connectivity to an equipment monitoring system when the electrical connection is determined, and sending an error message to the equipment monitoring system when the electrical connection is not determined.

In an example of the above aspect, sending the electrical signal includes sending a DC voltage pulse. In another example, sending the electrical signal from the electrical signal generator includes sending the electrical signal from a battery-operated electrical signal generator. In yet another example, sending the confirmation of electrical connectivity includes sending the confirmation wirelessly via a RF transmitter module. In other examples, sending the error message includes sending the error message wirelessly via a RF transmitter module. In other examples, sending an electrical signal from an electrical signal generator includes sending the electrical signal from a DC pulse circuit. In further examples, determining that the electrical connection exists includes detecting the sent electrical signal within a predetermined time period. In yet another example, sending the error message to the equipment monitoring system includes sending the error message when the electrical signal is not detected within a predetermined time period.

These and other features and advantages will be apparent from a reading of the following detailed description and a review of the associated drawings. A variety of additional aspects will be set forth in the description that follows. The aspects can relate to individual features and to combinations of features. It is to be understood that both the foregoing general description and the following detailed description are exemplary and explanatory only and are not restrictive of the broad concepts upon which the examples disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

The present disclosure relates to systems and methods for detecting the integrity of metallic conduit systems that carry electrical conductors within. During installation, conduits are connected to ground to prevent the possibility of shock due to leakage from the conduit. In some installations, conduits are externally connected to ground at one or many locations. Overtime, the ground connection can be damaged or weakened due to corrosion, rust, or some other harsh or detrimental environmental conditions affecting the conductive layer of the conduit, which may result in ground discontinuity.

Ground discontinuity can be checked manually by a technician, either via visual inspection, ground impedance measurement of an entire conduit's electrical system, or the use of electrical continuity testers. These techniques can be costly and time consuming, particularly for large industries that have long and complex networks of electrical cables. Furthermore, in such complex systems, it may be difficult to identify a specific fault location.

Another approach to monitoring ground discontinuity includes wrapping a copper coil around a conductor positioned within a conduit in order to measure an induced voltage across a resistor between the coil and the conduit at every measuring location. For this method, test repeatability and consistency can vary with the amount of copper coil surrounding the conductor. In some instances, a high volume of copper coil may be needed to reduce the ground impedance threshold detection.

Examples of the present disclosure address the above concerns and relate to a detection system and method for wirelessly monitoring a conductive layer of a conduit, e.g., a metallic conduit. In examples, the detection system and method may use the metallic conduit as a conductor to pass a short-length DC pulse between two locations, and determine whether there is an electrical discontinuity between the two locations, or between each location and the ground.

Advantageous features of the detection system according to the present disclosure include the ability to provide an automatic wireless method for detecting ground discontinuity in the conductive layer of a conduit. The detection system can be used as a plug-and-play device with no interference from other protection devices. Multiple receivers may be used to detect pulsed DC voltage at different locations in a complex network of conduits. As such, there may no longer be a need for measuring ground path impedance at various monitoring locations.

Figure 1:
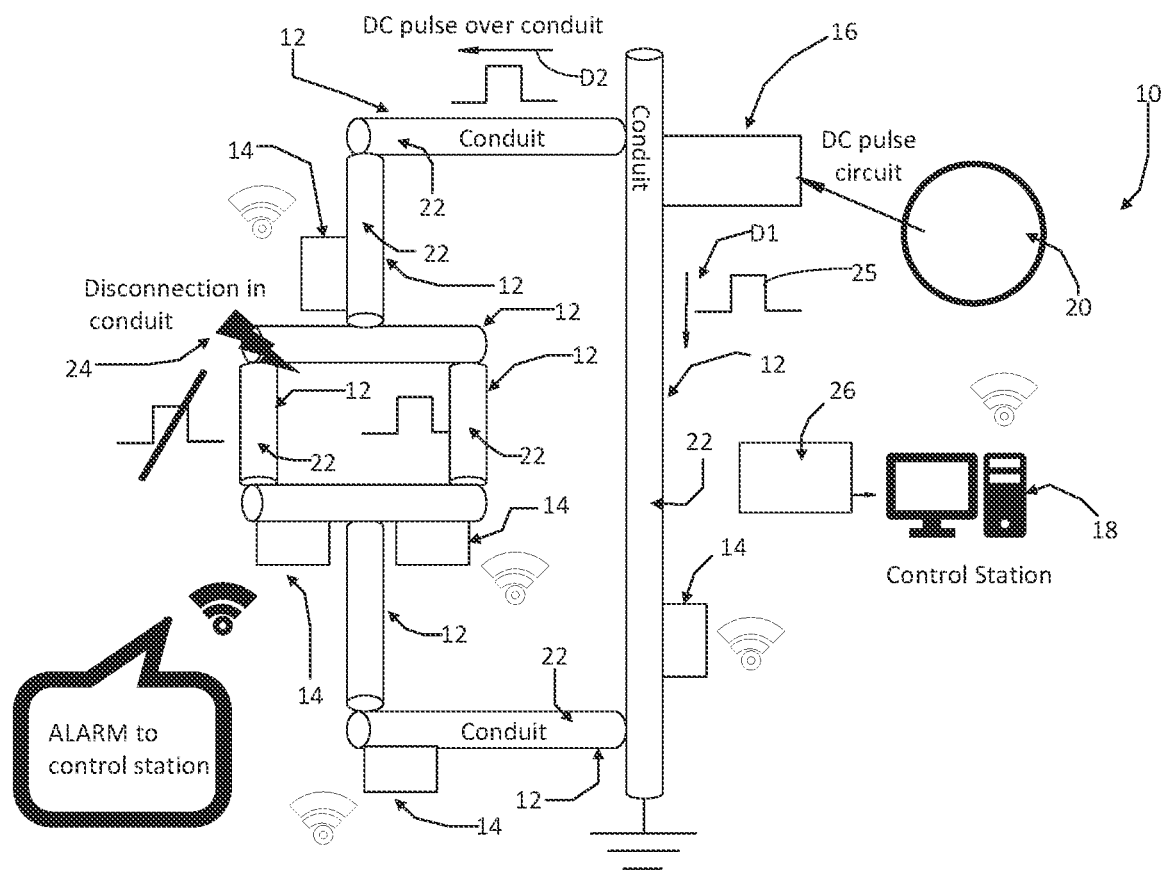
FIG. 1 is a diagram of an electrical conductor-carrying system, in accordance with principles of the present disclosure.

FIG. 1 illustrates a diagram of an electrical conductor-carrying system 10 for detecting damage in electrical conduits, in accordance with various examples of the disclosure. In examples, the electrical conductor-carrying system 10 includes a network of conduits 12 such as, e.g., conduit pipes, one or more detector devices 14 such as, e.g., receiving controllers, an electrical signal generator such as, e.g., a pulse generator 16, and a control station 18 including, e.g., an equipment monitoring system. In various examples, the network of conduits 12 are coupled together such that one conduit 12 can be coupled to at least one adjacent conduit 12. In various examples, one or more of the conduits 12 may include a cavity and may be, e.g., tubular in shape. In examples, one or more of the conduits 12 has a wall that forms a cavity 20 over the length of the conduit 12. For example, any one of the conduits 12, or the walls of the cavity 20 of the conduit 12, may each include a metallic material, such that the conduit 12 has a rigid construction. In an example, one or more of the conduits 12 may be made of, or include, electrically conductive material with a permanent and continuous path therethrough to ground. The ground may be, e.g., Earth ground per NEC standards. In certain examples, the conduits 12 may include an outer conductive layer 22 made of, or including, an electrically conductive material, such as, e.g., aluminum, or galvanized iron. In various examples, one or more electrical cables may be pulled through and disposed within the cavity 20 of the conduits 12. In examples, the pulse generator 16 may be or include a DC pulse circuit configured to deliver a DC pulse voltage to the outer conductive layer 22 of a conduit 12.

In various examples, the pulse generator 16 may deliver a voltage, e.g., a DC voltage, to the outer layer 22 of conduit 12, for a duration of up to 100 ms, up to 50 ms, or up to 20 ms. In other examples, if the DC voltage delivered by the pulse generator 16 is delivered for a duration that is greater than 100 ms, then other devices may interfere with the detection of the electrical signal. In other examples, if the DC voltage is delivered for a duration that is greater than 100 ms, then the electrical signal generator may cause malfunction of other protection devices connected to the conduit 12, or to ground, if any protection equipment is disposed within the conduit 12 or connected to the same grounding network. Accordingly, a DC voltage delivery duration of up to 100 ms, up to 50 ms, or up to 20 ms, is advantageous.

As defined herein, an electrical cable can be used to conduct power (e.g., high voltage) and/or control (e.g., low voltage) signals. Power flowing through an electrical cable can be alternating current or direct current. Each electrical cable can carry voltage and/or current from one end of the electrical cable to an opposite end thereof. Each electrical cable can have one or more electrical conductors disposed therein.

In certain examples, an electrical cable can include a ground or neutral conductor, through which no current or voltage, or only a negligible current or voltage, flows. The conductor may be of any suitable size, for example, 12 American Wire Gauge (AWG) or any other gauge or size from 4 gauge to 18 gauge or more, and may be made of or include one or more of a number of materials such as, e.g., copper, aluminum, or other such conducting material. In certain examples, the electrical cables may be coated with an insulator made of, or including, any suitable material such as, e.g., rubber, plastic, or any other such insulating material, to keep the conductors electrically isolated from any other conductor in the electrical cable.

In certain examples, one or more of the conduits 12 may be coupled to other electrical enclosures. In another example, one or more of the conduits 12 may be replaced with one or more of a number of other electrical conductor-carrying devices, such as, e.g., an armored cable. In other examples, one or more of the electrical enclosures may be replaced with one or more of a number of other electrical conductor-carrying devices, such as, e.g., a cable gland.

In various examples of the disclosure, a conduit 12 may be mechanically coupled to another conduit 12 and/or to an electrical enclosure (not shown) using a variety of coupling features that can complement coupling features disposed on an adjacent conduit 12. For example, one end of a conduit 12 can be coupled to another conduit 12 and/or to an electrical enclosure, and the other end of the conduit 12 can be coupled to another conduit 12 and/or to an electrical enclosure, so as to form a network of conduits 12 in the electrical conductor-carrying system 10, as illustrated in FIG. 1. For example, each end of the conduits 12 can include mating threads such that one end of the conduit 12 may include mating threads disposed on an outer surface thereof, and the other end of the conduit 12 would include mating threads disposed on an inner surface thereof. Accordingly, an end of a conduit 12 having mating threads on an outer surface thereof may be coupled to an end of an adjacent conduit 12 having mating threads on an inner surface thereof. In various examples, other attachment techniques may be used.

In various examples, still referring to FIG. 1, in examples, the pulse generator 16 may be disposed in any location on, or adjacent to, one of the conduits 12 in the electrical conductor-carrying system 10. The pulse generator 16 may include a controller that may include a processor, such as a processor mounted on a circuit board (e.g., wiring board, printed circuit board, printed wiring board, etc.). Example processors may include, but are not limited to, a microprocessor, a digital signal processor, an application-specific integrated circuit, a field programmable gate array, or the like, and are further described with respect to FIG. 5 below. The pulse generator 16 may be or include an electrical signal generator configured to deliver one or more electrical signals (e.g., a voltage or current) to an electrically conductive outer layer 22 of the conduits 12. In certain examples, the electrically conductive outer layer 22 may be a separate outer layer provided on the conduit 12. In certain examples, the electrically conductive outer layer 22 may be an outer surface or outer wall of the conduit 12. The electrically conductive outer layer 22 of the conduits 12 may be, e.g., electrically linked to the pulse generator 16 so that the pulse generator 16 delivers short length, low voltage DC pulses along a length of the metallic conduits 12 in the network. The electrically conductive outer layer 22 carries the pulse or signal generated by the pulse generator 16. In certain examples, the short length low voltage DC pulses may have a duration of up to 20 milliseconds. In certain examples, the short length low voltage DC pulses may have a duration of about 10 milliseconds to about 20 milliseconds. In certain examples, the short length low voltage DC pulses may have a duration of about 5 milliseconds to about 15 milliseconds.

In certain examples, the low voltage is no greater than about 5 volts, although alternatives are possible. The short length, low voltage waveform is designed to not interfere with protection equipment disposed within the conduit 12 or its grounding. In examples, the DC pulse generated by the pulse generator 16 can be configured at a different magnitude and time compared to the magnitude and time of the protection equipment.

In various examples, the pulse generator 16 may be battery operated to, e.g., allow for a portable or plug-and-play system. As such, the pulse generator 16 may not require an external or additional power source electrically linked to the conduits 12. For example, the metallic conduits 12 may be used as conductors to transmit the short-length DC pulses generated by the pulse generator 16. The DC pulses may be transmitted through the conductive outer layer 22 of the conduits 12 in the network of conduits 12 to the one or more detector devices 14 located at one or more locations in the electrical conductor-carrying system 10. In certain examples, the electrically conductive outer layer 22 may be unitary or integrated with the wall of the conducts 12. As such, the walls of the conduits 12 may carry the signals so that no additional wiring is required. The detector devices 14 may be configured to detect electrical signals from the electrically conductive outer layers 22 of the conduits 12. For example, the detector devices 14 can each include wireless transmitters/receivers for communicating wirelessly with the control station 18, which may be remote and not physically connected to the electrical conductor-carrying system 10. In other examples, a separate radio frequency (RF) transmitter module 26 may be provided in the electrical conductor-carrying system 10 to provide a wireless communication (e.g., transmit and/or receive radio signals) between the detector devices 14 and the control station 18. In examples, the detector devices 14 can be battery operated and configured to continuously, or substantially continuously, read the DC pulses transmitted through the conduits 12.

In various examples, still referring to FIG. 1, multiple detector devices 14 are provided in the electrical conductor-carrying system 10 at different locations in the network of conduits 12. The detector devices 14 can be configured with a logic program designed to receive and identify the DC signals in the network of multiple conduits 12. That is, the detector devices 14 can detect and measure characteristics of the electrical signals in the outer detection layer 22 of a given conduit 12 to detect damage to the outer detection layer 22. For example, initial readings of the signals may be taken to establish a baseline, or reference, that can be saved in memory against which subsequent readings taken in real-time can be compared against. In various examples, any deviations in the subsequent readings from the baseline reading may be indicative of a fault. Accordingly, damage to the wire, including potentially early damage to the insulation layer, or damage to the wire core, can be detected. If the damage happens gradually, damage to the outer conductive layer can be detected before the conduit fails or in some cases even is damaged.

In other examples, the electrical conductor-carrying system 10 may be a continuity testing system. As such, a signal may be sent from one location and detected at a second location within a given time to make sure electrical continuity exists without necessarily evaluating any characteristics of the signal.

Example methods of detecting damage to an electrical wire or other materials are also provided. The detector devices 14 can interface with the control station 18 in order to send a ground discontinuity status signal.

Figure 2:
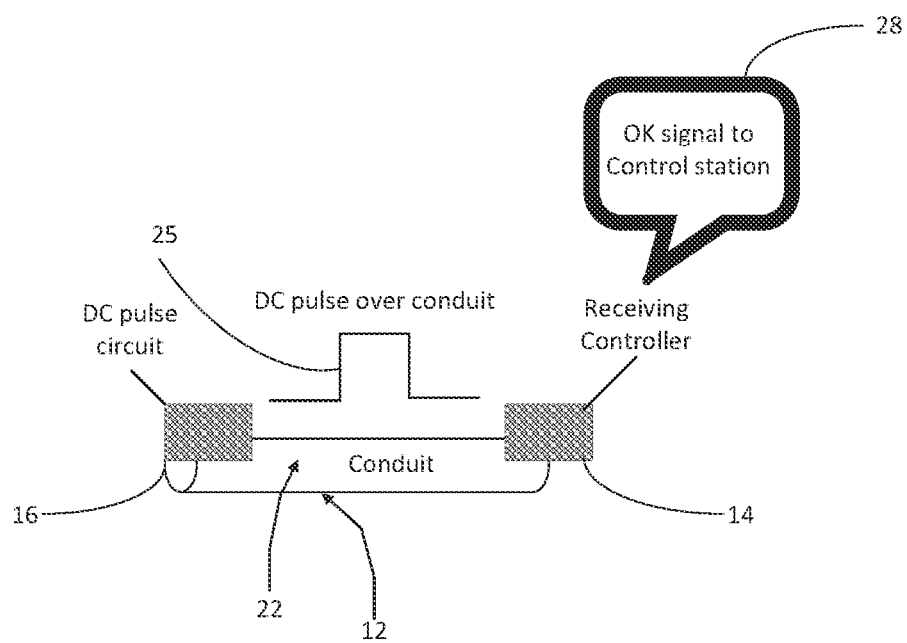
FIGS. 2-3 illustrate an example metallic conduit with a DC pulse transmitted across a length of the metallic conduit to be received by a receiving unit, in accordance with principles of the present disclosure.
Figure 3:
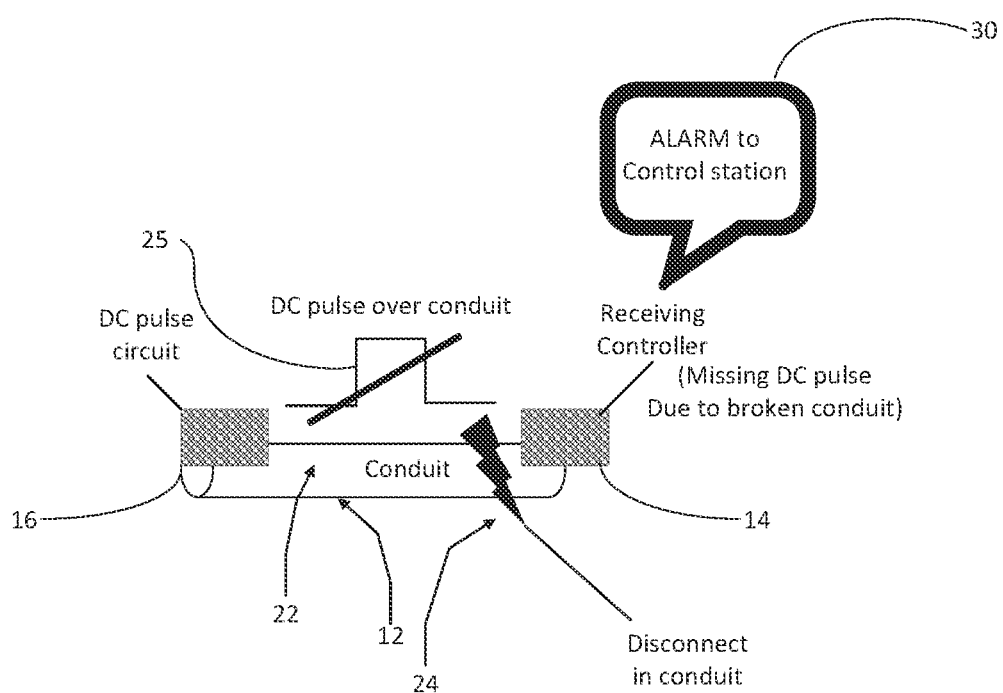

FIGS. 2-3 illustrate example metallic conduits with a DC pulse being transmitted across a length of the metallic conduits to be received by a receiving unit With respect to FIGS. 2-3, to detect damage to the electrically conductive outer layer 22, the electrical pulse (signal) 25 of voltage is transmitted from the pulse generator 16 at an end of a conduit 12 in the electrical conductor-carrying system 10.

The pulse 25 is shown in FIG. 1 to be moving in multiple directions D1 and D2 in the network of conduits 12 at different distances toward one of the detector devices 14. The examples illustrated in FIGS. 2 and 3 show the electrical pulse 25 of voltage passing through the electrically conductive outer layer 22 to reach a detector device 14. For example, the detector device 14 may confirm to the control station 18 illustrated in FIG. 1 that a pulse or signal has been received within a predetermined period of time from the origin of the pulse or signal 25. In various examples, the detector device 14 can communicate wirelessly with the control station 18 via, e.g., the radio frequency (RF) transmitter module 26 illustrated in FIG. 1, once the pulse or signal is detected, to send an "OK" signal 28. The "OK" signal 28 may be immediate, or substantially immediate, so as to avoid a false detection of ground discontinuity due to, e.g., a time delay in delivering the "OK" signal 28.

As used herein, the term, "a predetermined period of time" and variants thereof, in this context, without more, means a time sufficient for the detector device 14 to confirm the indication of the pulse or signal 25 that there is an electrical connection, and thus to avoid being interpreted falsely as a ground discontinuity. Furthermore, in this context, the term, "a predetermined period of time," without more, means a time period in which the detector device 14 detection is complete.

For example, the detector device 14 can be configured to detect the pulse or signal 25 continuously through the predetermined period of time. This can be done with electronic components now known or later developed, including through use of appropriate chips, printed circuit boards, control arrangements, etc. For example, the detector devices 14 can include appropriate programing, such as via printed circuit boards, chip systems, or other systems now known or later developed, as further described below with reference to FIG. 5. The electronic controller includes appropriate programming with timers, other programing, and the like, to detect the pulse or signal 25 as reflected in the depicted and described flow chart below in FIG. 4.

FIGS. 1 and 3 also illustrate a break 24 in the electrically conductive outer layer 22 of one of the conduits 12. For example, when there is a break 24 in the electrically conductive outer layer 22, the electrical pulse of voltage 25 may not reach the detector device 14, and may be instead returned back to the electrical generator or circuit board 16. In various examples, the detector device 14 may not receive or detect the electrical signal 25 over the electrically conductive outer layer 22 due to an electrical disconnection due to an open circuit or a break in the conduit 12. For example, an electrical disconnection identifies for a user a location in the network of a damage in the outer electrically conductive material layer 22 of the conduit 12. For example, the detector devices 14 may include a microcontroller configured to detect pulses or signals 25 in the electrically conductive outer layer 22. Generally, when the electrically conductive outer layer 22 is damaged, broken, or defective due to, e.g., rust or other external damage that can break the electrical connection of the conduit 12, the DC pulse or electrical connectivity is lost such that the detector devices 14 can no longer detect the pulse or signal 25 from the electrically conductive outer layer 22. In other examples, after the predetermined selected period time, the detector devices 14 are arranged and configured to create a continuity fault signal or error signal that can be wirelessly sent to the control station 18 where a user can be notified of the status of the conductive outer layer 22 of the given conduit 12. For example, the detector devices 14 can be programmed or configured with the pre-determined selected period of time within which the pulse or signal 25 can be received before triggering the alarm signal. That is, if the detector devices 14 do not detect the DC pulse or signal within the predetermined period of time, the detector devices 14 may trigger an alarm 30 signal indicating ground discontinuity.

In various examples, both the pulse generator 16 and the detector devices 14 may be programmed to operate during an active mode while sending/reading DC pulses 25 and/or sending 'OK' or 'ALARM' signals 30 to the control station 18. The pulse generator 16 and detector devices 14 may then enter a sleep or standby mode when not active, in order to save power, which may increase battery life thereof.

Figure 4:
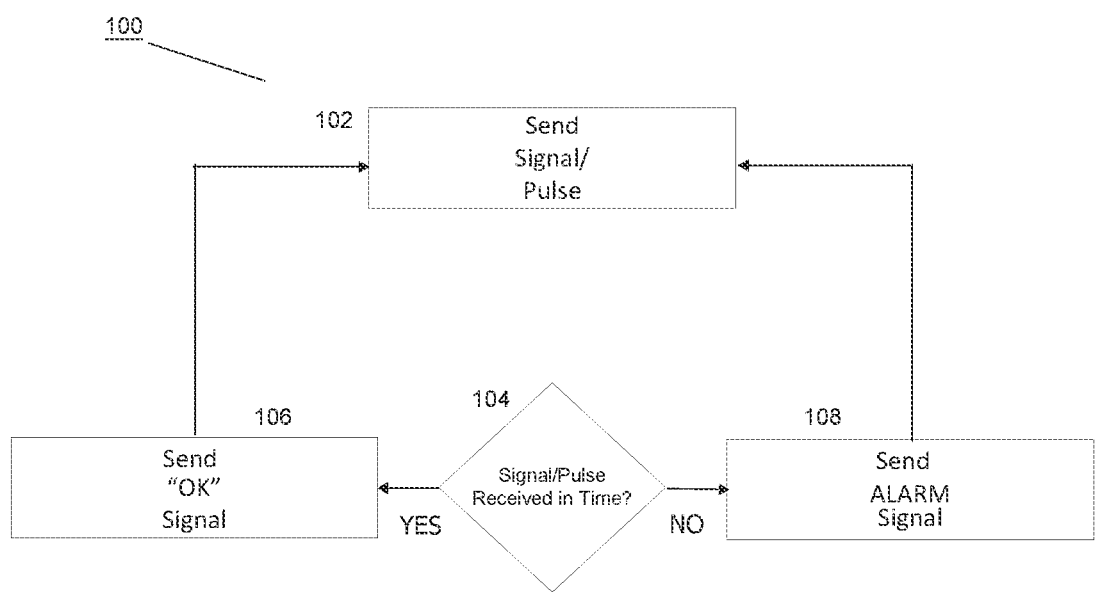
FIG. 4 is a flow chart describing a method of evaluating electrical discontinuity in a system of metallic conduits, in accordance with principles of the present disclosure.

FIG. 4 is a flow chart describing a method of evaluating electrical discontinuity in a system of metallic conduits, in accordance with examples of the present disclosure. Referring to FIG. 4, a schematic flow chart 100 is depicted illustrating a system with, e.g., an electrical conductor-carrying system 10 as illustrated in FIG. 1 and configured to detect ground discontinuity, in accordance with the present disclosure. The flow chart 100 shows operations that, e.g., the pulse generator 16 and detector devices 14 illustrated in FIG. 1 may perform in the network of conduits 12, in accordance with various examples.

For examples, during operation 102, the pulse generator 16 is powered on to generate a pulse or a signal such as, e.g., a DC pulse, from an origin in the electrical conductor-carrying system 10 illustrated in FIG. 1. The DC pulse or signal may be configured to be transmitted over one or more of the electrical conduits 12 via, e.g., the outer conducting surface 22 of the electrical conduits 12.

In examples, operation 104 includes determining whether the detector devices 14 detect the DC pulse or signal over the electrically conductive outer layers 22 of the one or more electrical conduits 12, as illustrated in FIG. 1, within the predetermined period of time. If the DC pulse or signal is detected within the predetermined period of time, then operation 106 includes sending an "OK" signal, e.g., by the receiving unit 14 to the control station 18 via, e.g., a wireless communication. If no pulse or signal is detected within the predetermined period of time, operation 108 includes sending an error signal, e.g., by the receiving unit 14 to the control station 18 illustrated in FIG. 1. For example, if DC pulses or signals are not detected within the predetermined period of time, operation 108 includes sending an alarm signal to the control station 18 via, e.g., the RF Transmitter module 26 illustrated in FIG. 1, or a printed circuit board sub-assembly configured to transmit a radio wave and to modulate that wave to carry data. During operation 108, the detector devices 14 may identify the location of the discontinuity in the conduits 12 based on the alarm based on alarm data collected by the detector devices 14. In various examples, once operation 106 or operation 108 is performed, the method 100 continues to operations 102 and 104 to continue sending and monitoring signal pulses.

Figure 5:
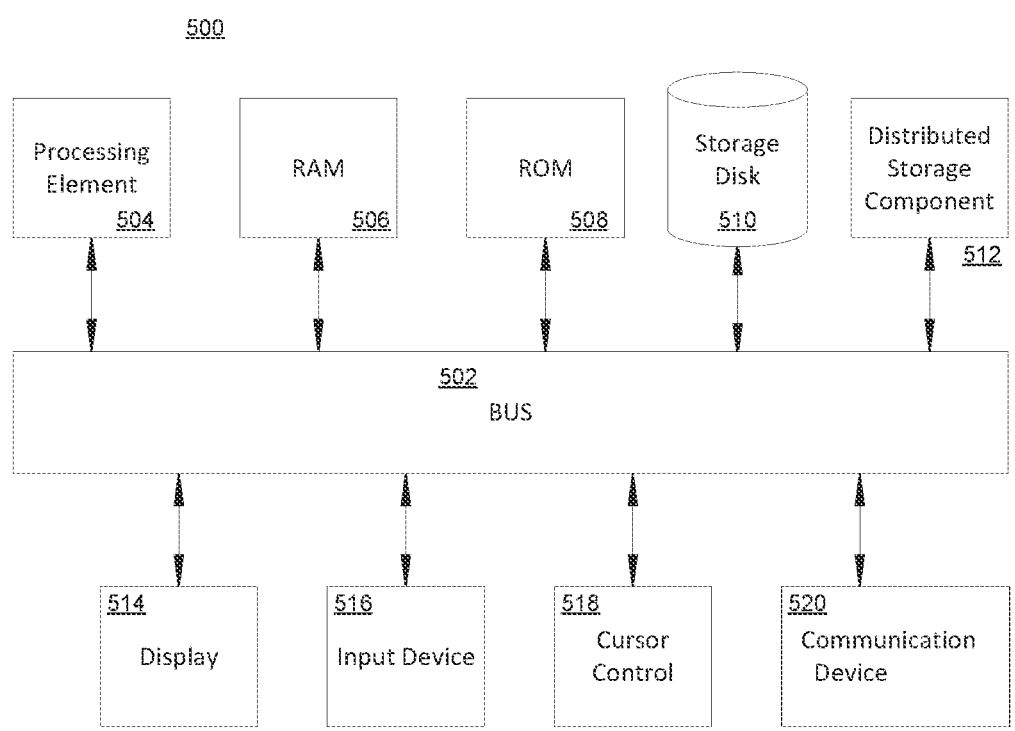
FIG. 5 depicts a block diagram of a computing device.

FIG. 5 depicts a block diagram of a computing device. In the illustrated example, the computing device 500 may include a bus 502 or other communication mechanism of similar function for communicating information, and at least one processing element 504 (collectively referred to as processing element 504) coupled with bus 502 for processing information. As will be appreciated by those skilled in the art, the processing element 504 may include a plurality of processing elements or cores, which may be packaged as a single processor or in a distributed arrangement. Furthermore, a plurality of virtual processing elements 504 may be included in the computing device 500 to provide the control or management operations for, e.g., the system 10 illustrated above.

The computing device 500 may also include one or more volatile memory(ies) 506, which can for example include random access memory(ies) (RAM) or other dynamic memory component(s), coupled to one or more busses 502 for use by the at least one processing element 504. Computing device 500 may further include static, non-volatile memory(ies) 508, such as read only memory (ROM) or other static memory components, coupled to busses 502 for storing information and instructions for use by the at least one processing element 504. A storage component 510, such as a storage disk or storage memory, may be provided for storing information and instructions for use by the at least one processing element 504. As will be appreciated, the computing device 500 may include a distributed storage component 512, such as a networked disk or other storage resource available to the computing device 500.

The computing device 500 may be coupled to one or more displays 514 for displaying information to a user. Optional user input device(s) 516, such as a keyboard and/or touchscreen, may be coupled to Bus 502 for communicating information and command selections to the at least one processing element 504. An optional cursor control or graphical input device 518, such as a mouse, a trackball or cursor direction keys for communicating graphical user interface information and command selections to the at least one processing element. The computing device 500 may further include an input/output (I/O) component, such as a serial connection, digital connection, network connection, or other input/output component for allowing intercommunication with other computing components and the various components of, e.g., the system 10 illustrated above.

In various embodiments, computing device 500 can be connected to one or more other computer systems via a network to form a networked system. Such networks can for example include one or more private networks or public networks, such as the Internet. In the networked system, one or more computer systems can store and serve the data to other computer systems. The one or more computer systems that store and serve the data can be referred to as servers or the cloud in a cloud computing scenario. The one or more computer systems can include one or more web servers, for example. The other computer systems that send and receive data to and from the servers or the cloud can be referred to as client or cloud devices, for example. Various operations of, e.g., the system 10 illustrated above may be supported by operation of the distributed computing systems.

The control station 18 discussed above with respect to FIG. 1, similar to the computing device 500, may be operative to control operation of the components of the system 10 illustrated above through a communication device such as, e.g., communication device 520, and to handle data generated by components of the system 10. In some examples, analysis results are provided by the computing device 500 in response to the at least one processing element 504 executing instructions contained in memory 506 or 508 and performing operations on data received from the system 10. Execution of instructions contained in memory 506 and/or 508 by the at least one processing element 504 can render, e.g., the system 10 illustrated above.

The term "computer-readable medium" as used herein refers to any media that participates in providing instructions to the processing element 504 for execution. Such a medium may take many forms, including but not limited to, non-volatile media, volatile media, and transmission media. Non-volatile media includes, for example, optical or magnetic disks, such as disk storage 510. Volatile media includes dynamic memory, such as memory 506. Transmission media includes coaxial cables, copper wire, and fiber optics, including the wires that include bus 502.

Common forms of computer-readable media or computer program products include, for example, a floppy disk, a flexible disk, hard disk, magnetic tape, or any other magnetic medium, a CD-ROM, digital video disc (DVD), a Blu-ray Disc, any other optical medium, a thumb drive, a memory card, a RAM, PROM, and EPROM, a FLASH-EPROM, any other memory chip or cartridge, or any other tangible medium from which a computer can read.

Various forms of computer readable media may be involved in carrying one or more sequences of one or more instructions to the processing element 504 for execution. For example, the instructions may initially be carried on the magnetic disk of a remote computer. The remote computer can load the instructions into its dynamic memory and send the instructions over a telephone line using a modem. A modem local to computing device 500 can receive the data on the telephone line and use an infra-red transmitter to convert the data to an infra-red signal. An infra-red detector coupled to bus 502 can receive the data carried in the infra-red signal and place the data on bus 502. Bus 502 carries the data to memory 506, from which the processing element 504 retrieves and executes the instructions. The instructions received by memory 506 and/or memory 508 may optionally be stored on storage device 510 either before or after execution by the processing element 504.

In accordance with various embodiments, instructions operative to be executed by a processing element to perform a method are stored on a computer-readable medium. The computer-readable medium can be a device that stores digital information. For example, a computer-readable medium includes a compact disc read-only memory (CD-ROM) as is known in the art for storing software. The computer-readable medium is accessed by a processor suitable for executing instructions configured to be executed.

The principles, techniques, and features described herein can be applied in a variety of systems (e.g., live low voltage busbar, low voltage busway housing, cable tray etc.), and there is no requirement that all of the advantageous features identified be incorporated in an assembly, system or component to obtain some benefit according to the present disclosure.

From the forgoing detailed description, it will be evident that modifications and variations can be made without departing from the spirit and scope of the disclosure.

This disclosure described some examples of the present technology with reference to the accompanying drawings, in which only some of the possible examples were shown. Other aspects can, however, be embodied in many different forms and should not be construed as limited to the examples set forth herein. Rather, these examples were provided so that this disclosure was thorough and complete and fully conveyed the scope of the possible examples to those skilled in the art.

Although specific examples were described herein, the scope of the technology is not limited to those specific examples. One skilled in the art will recognize other examples or improvements that are within the scope of the present technology. Therefore, the specific structure, acts, or media are disclosed only as illustrative examples. Examples according to the technology may also combine elements or components of those that are disclosed in general but not expressly exemplified in combination, unless otherwise stated herein. The scope of the technology is defined by the following claims and any equivalents therein.

What is claimed is:

1. A wireless electrical discontinuity detection system comprising:
    at least one conduit having an electrically conductive outer layer comprising an electrically conductive material;
    an electrical signal generator electrically coupled to a first portion of the at least one conduit, the electrical signal generator being configured to deliver electrical signals to the outer layer of the at least one conduit; and
    a detector device coupled to a second portion of the at least one conduit, the second portion being spaced from the first portion along the at least one conduit, the detector device being configured to detect an electrical signal from the electrically conductive outer layer, and the detector device being configured to identify at least one of electrical connection and ground discontinuity between the first and second portions along the at least one conduit based on the detected electrical signal;
    wherein the detector device is in wireless communication with a control station and is configured to send the control station a signal indicative of a ground discontinuity when the electrical signal is not detected within a predetermined time period.

2. The wireless electrical discontinuity detection system of claim 1, wherein the electrical signal generator is a DC pulse circuit.

3. The wireless electrical discontinuity detection system of claim 2, wherein the DC pulse circuit is configured to deliver DC voltage for a duration that is no greater than 100 ms.

4. The wireless electrical discontinuity detection system of claim 2, wherein the DC pulse circuit is configured to deliver DC voltage for a duration of up to 50 ms.

5. The wireless electrical discontinuity detection system of claim 2, wherein the DC pulse circuit is configured to deliver DC voltage for a duration of up to 20 ms.

6. The wireless electrical discontinuity detection system of claim 2, wherein the DC pulse circuit is configured to deliver a DC voltage of up to 5 V.

7. The wireless electrical discontinuity detection system of claim 2, wherein the DC pulse circuit is battery operated.

8. The wireless electrical discontinuity detection system of claim 1, wherein the detector device is in wireless communication with the control station via a wireless transmitter module.

9. The wireless electrical discontinuity detection system of claim 8, wherein the wireless transmission module is an RF transmitter module.

10. The wireless electrical discontinuity detection system of claim 1, wherein the electrical signal generator is housed within the at least one conduit.

11. The wireless electrical discontinuity detection system of claim 1, wherein the at least one conduit comprises a plurality of conduits.

12. The wireless electrical discontinuity detection system of claim 11, wherein one of the plurality of conduits is coupled to an adjacent one of the plurality of conduits.

13. The wireless electrical discontinuity detection system of claim 12, wherein:
    the one of the plurality of conduits comprises a first mating thread at an outer surface thereof; and
    the adjacent one of the plurality of conduits comprises a second mating thread at an inner surface thereof, the second mating thread being configured to mate with the first mating thread to connect the one of the plurality of conduits with the adjacent one of the plurality of conduits.

14. The wireless electrical discontinuity detection system of claim 1, wherein the at least one conduit comprises a cavity.

15. The wireless electrical discontinuity detection system of claim 14, wherein the cavity of the at least one conduit is tubular in shape.

16. The wireless electrical discontinuity detection system of claim 14, wherein the cavity of the at least one conduit extends over a length of the at least one conduit.

17. The wireless electrical discontinuity detection system of claim 1, wherein the at least one conduit comprises an electrically conductive material connected to ground.

18. The wireless electrical discontinuity detection system of claim 1, wherein the at least one conduit is configured to receive one or more electrical cables therein.

19. A method of evaluating electrical discontinuity for a metallic conduit, the method comprising:
    sending an electrical signal from an electrical signal generator coupled to a first portion of the metallic conduit across the metallic conduit;
    detecting the sent electrical signal transmitted across the metallic conduit at a second portion of the metallic conduit, the second portion being spaced from the first portion along the metallic conduit;
    determining whether an electrical connection exists between the first and second portions based on the detected sent electrical signal;
    sending a confirmation of electrical connectivity to an equipment monitoring system when the electrical connection is determined; and
    sending an error message to the equipment monitoring system when the electrical connection is determined not to exist.

20. The method of claim 19, wherein sending the electrical signal comprises sending a DC voltage pulse.

21. The method of claim 19, wherein sending the electrical signal from the electrical signal generator comprises sending the electrical signal from a battery-operated electrical signal generator.

22. The method of claim 19, wherein sending the confirmation of electrical connectivity comprises sending the confirmation wirelessly via a RF transmitter module.

23. The method of claim 19, wherein sending the error message comprises sending the error message wirelessly via a RF transmitter module.

24. The method of claim 19, wherein sending an electrical signal from an electrical signal generator comprises sending the electrical signal from a DC pulse circuit.

25. The method of claim 19, wherein determining that the electrical connection exists comprises detecting the sent electrical signal within a predetermined time period.

26. The method of claim 19, wherein sending the error message to the equipment monitoring system comprises sending the error message when the electrical signal is not detected within a predetermined time period.

27. The wireless electrical discontinuity detection system of claim 1, wherein the first portion is at one end of the at least one conduit and the second portion is at an opposite end of the at least one conduit from the first portion.

28. The method of claim 19, wherein the first portion is at one end of the metallic conduit and the second portion is at an opposite end of the metallic conduit from the first portion.

29. The wireless electrical discontinuity detection system of claim 1, wherein the electrical signal generator and the detector device are coupled together via a single conduit.

30. The method of claim 19, wherein the electrical signal generator and a detector device that detects the sent electrical signal are coupled together via a single conduit.

\* \* \* \* \*